United States Patent
Wu et al.

(10) Patent No.: US 11,144,695 B2
(45) Date of Patent: Oct. 12, 2021

(54) WAFER CHARACTERISTIC PREDICTION METHOD AND ELECTRONIC DEVICE

(71) Applicant: DigWise Technology Corporation, LTD, Hsinchu County (TW)

(72) Inventors: JingJie Wu, Beijing (CN); Yuan-Hung Liao, Hsinchu County (TW); Chih-Chen Liu, Hsinchu County (TW)

(73) Assignee: DigWise Technology Corporation, LTD, Hsinchu County (TW)

( * ) Notice: Subject to any disclaimer, the term of this patent is extended or adjusted under 35 U.S.C. 154(b) by 323 days.

(21) Appl. No.: 16/517,700

(22) Filed: Jul. 22, 2019

(65) Prior Publication Data
US 2020/0334338 A1    Oct. 22, 2020

(30) Foreign Application Priority Data
Apr. 22, 2019   (TW) .................. 108114012

(51) Int. Cl.
*G06F 30/30* (2020.01)
*G06F 30/367* (2020.01)
*H04N 19/50* (2014.01)

(52) U.S. Cl.
CPC ............ *G06F 30/367* (2020.01); *G06F 30/30* (2020.01); *H04N 19/50* (2014.11)

(58) Field of Classification Search
None
See application file for complete search history.

(56) References Cited

U.S. PATENT DOCUMENTS

| | | | | |
|---|---|---|---|---|
| 5,313,398 A | * | 5/1994 | Rohrer ................. | G06F 30/367 703/14 |
| 6,735,748 B1 | * | 5/2004 | Teig ...................... | G06F 30/367 716/115 |
| 6,795,800 B1 | * | 9/2004 | Lee ....................... | G06F 30/367 703/2 |
| 7,051,293 B1 | | 5/2006 | Teig et al. | |
| 8,374,839 B2 | * | 2/2013 | Satoh .................... | G06F 30/367 703/14 |
| 9,026,964 B2 | | 5/2015 | Mohanty et al. | |

FOREIGN PATENT DOCUMENTS

| | | |
|---|---|---|
| CN | 103955579 | 7/2014 |
| TW | I534445 | 5/2016 |
| TW | I573215 | 3/2017 |
| TW | I598582 | 9/2017 |

OTHER PUBLICATIONS

"Office Action of Taiwan Counterpart Application", dated Mar. 5, 2020, p. 1-6.

* cited by examiner

*Primary Examiner* — Craig C Dorais
(74) *Attorney, Agent, or Firm* — JCIPRNET (57) ABSTRACT

A wafer characteristic prediction method and an electronic device are provided. The method includes: receiving a process parameter of a wafer during a mass production; inputting the process parameter to a prediction model to obtain a wafer characteristic of the wafer being mass produced; and outputting the wafer characteristic.

16 Claims, 11 Drawing Sheets

WAFER CHARACTERISTIC PREDICTION METHOD AND ELECTRONIC DEVICE

CROSS-REFERENCE TO RELATED APPLICATION

This application claims the priority benefit of Taiwan application serial no. 108114012, filed on Apr. 22, 2019. The entirety of the above-mentioned patent application is hereby incorporated by reference herein and made a part of this specification.

BACKGROUND OF THE INVENTION

1. Field of the Invention

The invention relates to a wafer characteristic prediction method and an electronic device.

2. Description of Related Art

In general, a SPICE (Simulation Program with Integrated Circuit Emphasis) model may be used to predict circuit behaviors, which allow circuit designers to learn of characteristics of the manufactured product before production. However, a condition and a range that the SPICE model can currently simulate are limited. For example, a process parameter used in an actual production may exceed the range that the SPICE model can support. In this case, a wafer characteristic of the wafer after a mass production cannot be predicted effectively, nor can a timing sign-off operation be effectively executed.

SUMMARY OF THE INVENTION

Accordingly, the invention provides a wafer characteristic prediction method and an electronic device that can effectively predict the wafer characteristic of the wafer being mass produced and can perform the timing sign-off operation more effectively.

The invention proposes a wafer characteristic prediction method for an electronic device. The electronic device includes an input circuit, a processor and an output circuit. The method includes: receiving a process parameter of a wafer during a mass production by the input circuit; inputting the process parameter to a prediction model to obtain a wafer characteristic of the wafer being mass produced by the processor; and outputting the wafer characteristic by the output circuit.

In an embodiment of the invention, before the step of receiving the process parameter of the wafer during the mass production, the method further includes: performing a simulation to obtain training data by the processor, wherein the training data includes a training process parameter and a training wafer characteristic; and training the prediction model according to the training data by the processor.

In an embodiment of the invention, the step of performing the simulation to obtain the training data includes: executing a simulation including a SPICE (Simulation Program with Integrated Circuit Emphasis) model to simulate a test circuit, and obtaining the training data according to a simulation result of the test circuit by the processor, wherein a range of the process parameter in the prediction model is greater than a range of the process parameter in the SPICE model, and a predictable range corresponding to the wafer characteristic in the prediction model is greater than a predictable range corresponding to the wafer characteristic in the SPICE model.

In an embodiment of the invention, the step of executing the SPICE model to simulate the test circuit includes: executing a SPICE Monte Carlo analysis to simulate the test circuit by the processor.

In an embodiment of the invention, the process parameter includes at least one of a saturation current, a cutoff region current, a linear region threshold voltage and a saturation region threshold voltage.

In an embodiment of the invention, the wafer characteristic includes an operating frequency and a leakage current.

In an embodiment of the invention, the method further includes: using the prediction model according to a target wafer characteristic to be achieved to obtain the process parameter corresponding to the target wafer characteristic by the processor.

In an embodiment of the invention, the method further includes: obtaining a numerical range to be additionally considered for the wafer characteristic when executing a sing-off operation according to a shift between a first mean value of the process parameter and a second mean value of another process parameter in the prediction model by the processor.

The invention proposes an electronic device. The electronic device includes an input circuit, an output circuit, and a processor. Each of the input circuit and the output circuit is coupled to the processor. The input circuit receives a process parameter of a wafer during a mass production. The processor inputs the process parameter to a prediction model to obtain a wafer characteristic of the wafer being mass produced. The output circuit outputs the wafer characteristic.

In an embodiment of the invention, before the operation of receiving the process parameter of the wafer during the mass production, the processor performs a simulation to obtain training data. Here, the training data includes a training process parameter and a training wafer characteristic. The processor trains the prediction model according to the training data.

In an embodiment of the invention, in the operation of performing the simulation to obtain the training data, the processor executes a SPICE (Simulation Program with Integrated Circuit Emphasis) model to simulate a test circuit, and obtains the training data according to a simulation result of the test circuit, wherein a range of the process parameter in the prediction model is greater than a range of the process parameter in the SPICE model, and a predictable range corresponding to the wafer characteristic in the prediction model is greater than a predictable range corresponding to the wafer characteristic in the SPICE model.

In an embodiment of the invention, in the operation of executing the SPICE model to simulate the test circuit, the processor executes a SPICE Monte Carlo analysis to simulate the test circuit.

In an embodiment of the invention, the process parameter includes at least one of a saturation current, a cutoff region current, a linear region threshold voltage and a saturation region threshold voltage.

In an embodiment of the invention, the wafer characteristic includes an operating frequency and a leakage current.

In an embodiment of the invention, the processor uses the prediction model according to a target wafer characteristic to be achieved to obtain the process parameter corresponding to the target wafer characteristic.

In an embodiment of the invention, the processor obtains a numerical range to be additionally considered for the wafer characteristic when performing a sing-off operation according to a shift between a first mean value of the process parameter and a second mean value of another process parameter in the prediction model.

Based on the above, the wafer characteristic prediction method and the electronic device of the invention can generate the training data through the SPICE model, and train the prediction model according to the training data. Then, the prediction model may be used to predict the wafer characteristic of the wafer being mass produced according to the process parameter of the wafer during the mass production. In particular, the predictable range corresponding to the wafer characteristic in the prediction model is greater than the predictable range corresponding to the wafer characteristic in the SPICE model. Accordingly, not only can the wafer characteristic of the wafer being mass produced be predicted effectively, but the timing sign-off operation can also be executed more effectively.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Descriptions of the invention are given with reference to the exemplary embodiments illustrated with accompanied drawings, in which same or similar parts are denoted with the same reference numerals. In addition, whenever possible, identical or similar reference numbers stand for identical or similar elements in the figures and the embodiments.

Figure 1:
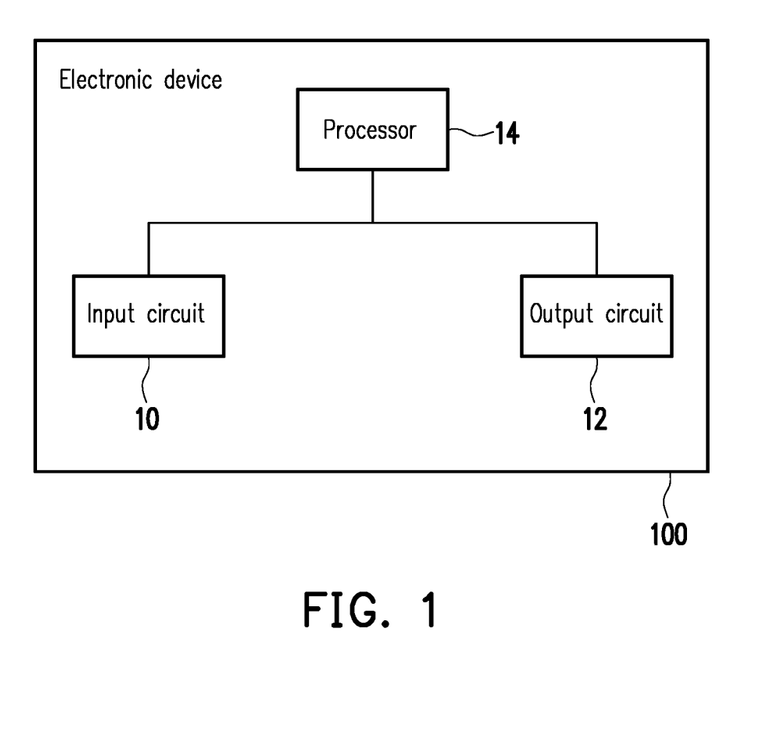
FIG. 1 is a schematic diagram illustrating an electronic device according to an embodiment of the invention.

FIG. 1 is a schematic diagram illustrating an electronic device according to an embodiment of the invention.

With reference to FIG. 1, an electronic device 100 includes an input circuit 10, an output circuit 12 and a processor 14. Among them, each of the input circuit 10 and the output circuit 12 is coupled to the processor 14. The electronic device 100 is, for example, an electronic device, such as a cell phone, a tablet computer or a notebook computer, which are not particularly limited herein.

The input circuit 10 may be a device or an element for obtaining data, such as a keyboard, a mouse or a microphone. Alternatively, the input circuit 10 may be an interface for obtaining data from other devices (e.g., a storage medium), but not limited thereto.

The output circuit 12 is, for example, a display circuit that can be used for display, a communication element that transmits signals, a speaker that plays voice signals, or an interface for connecting other devices (e.g., a storage medium or a display), but not limited thereto.

The processor 14 may be a central processing unit (CPU) or other programmable devices for general purpose or special purpose such as a microprocessor and a digital signal processor (DSP), a programmable controller, an application specific integrated circuit (ASIC) or other similar devices or a combination of above-mentioned devices, but not limited thereto.

The electronic device 100 may include a storage circuit (not illustrated), which may be a fixed or a movable element in any possible forms including a random access memory (RAM), a read-only memory (ROM), a flash memory or other similar elements, or a combination of the above-mentioned elements, but not limited thereto.

In this exemplary embodiment, the storage circuit (not illustrated) in the electronic device 100 is stored with a plurality of program code segments. The program code segments may be executed by the processor 14 after being installed and executed. For example, the storage circuit includes a plurality of modules, and operations of the electronic device 100 are respectively executed by these modules. Here, each of the modules is composed of one or more program code segments. In an embodiment, the program code segments may also software or scripts that require no installation. However, the invention is not limited in this regard. Each operation of the electronic device 100 may also be implemented in other hardware manners.

Figure 2:
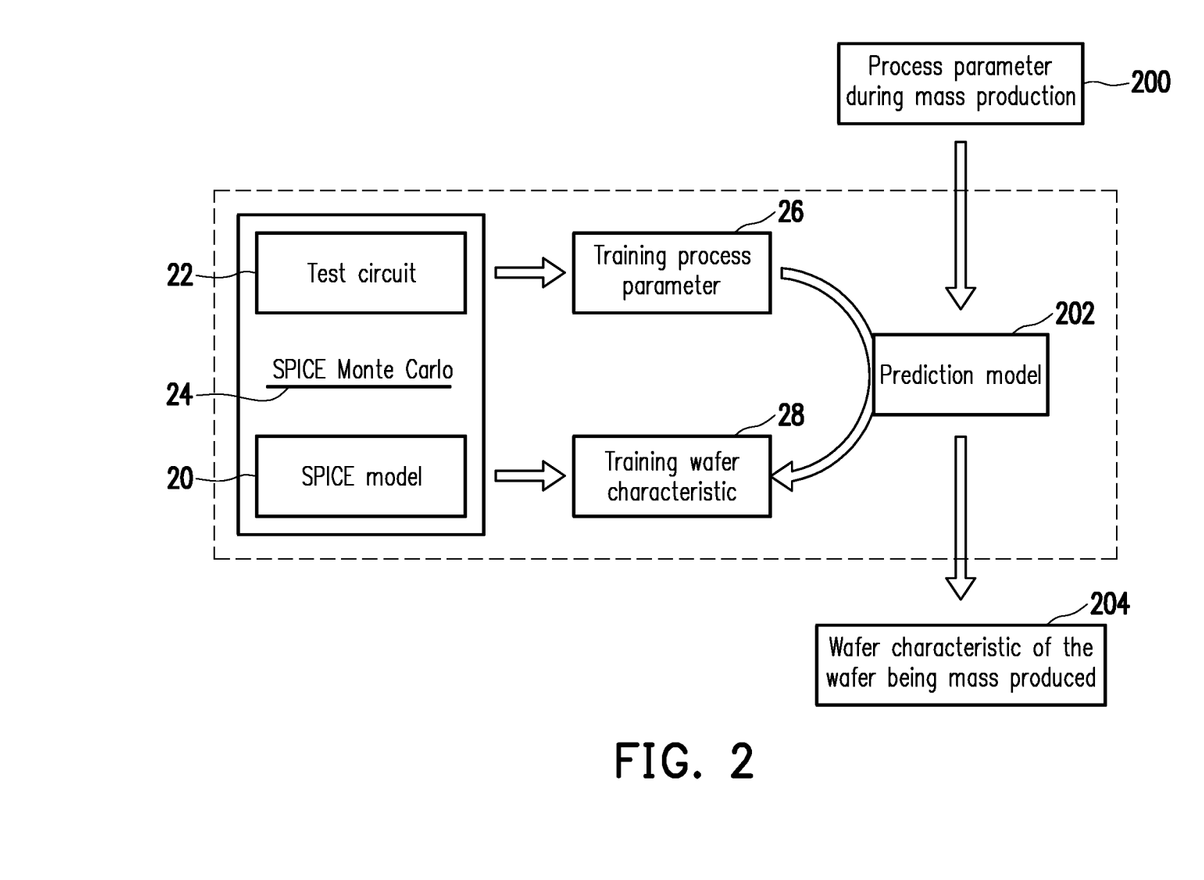
FIG. 2 is a schematic diagram illustrating a wafer characteristic prediction method according to an embodiment of the invention.

FIG. 2 is a schematic diagram illustrating a wafer characteristic prediction method according to an embodiment of the invention.

With reference to FIG. 2, in this embodiment, the processor 14 can generate a prediction model 202 first. More specifically, the processor 14 executes a simulation including a SPICE model 20 to simulate a test circuit 22. For example, the processor 14 executes a SPICE Monte Carlo analysis 24 to simulate the test circuit 22. Then, the processor 14 obtains training data according to a simulation result of the test circuit 22. In this embodiment, the training data includes a training process parameter 26 and a training wafer characteristic 28. The processor 14 can, for example, train the prediction model 202 by using the training data. For example, the processor 14 can give each (or each group) of training process parameter 26 one (or one group of) specific solution (e.g., a specific wafer characteristic in the training wafer characteristic) to thereby train the prediction model 202. The training process may be learnt from the conventional technology, which is not repeated hereinafter.

Then, the input circuit 10 receives a process parameter 200 of a wafer during a mass production. The processor 14 inputs the process parameter 200 to the prediction model 202 to obtain a wafer characteristic 204 of the wafer being mass produced (or known as a predicted wafer characteristic). Lastly, the output circuit 12 can output the wafer characteristic 204 being mass produced.

In this embodiment, said process parameter includes at least one of a saturation current (abbreviated as Isat), a cutoff region current (abbreviated as Ioff), a linear region threshold voltage (abbreviated as Vtl) and a saturation region threshold voltage (abbreviated as Vts). In addition, the wafer characteristic includes an operating frequency and a leakage current.

The following embodiments are described by using the saturation current (i.e., the process parameter is the saturation current) as an example of input to the prediction model 202 to predict the wafer characteristic 204 being mass produced.

FIG. 3A to FIG. 3H are schematic diagrams illustrating distributions of the process parameter and the wafer characteristic according to an embodiment of the invention.

Figure 3A:
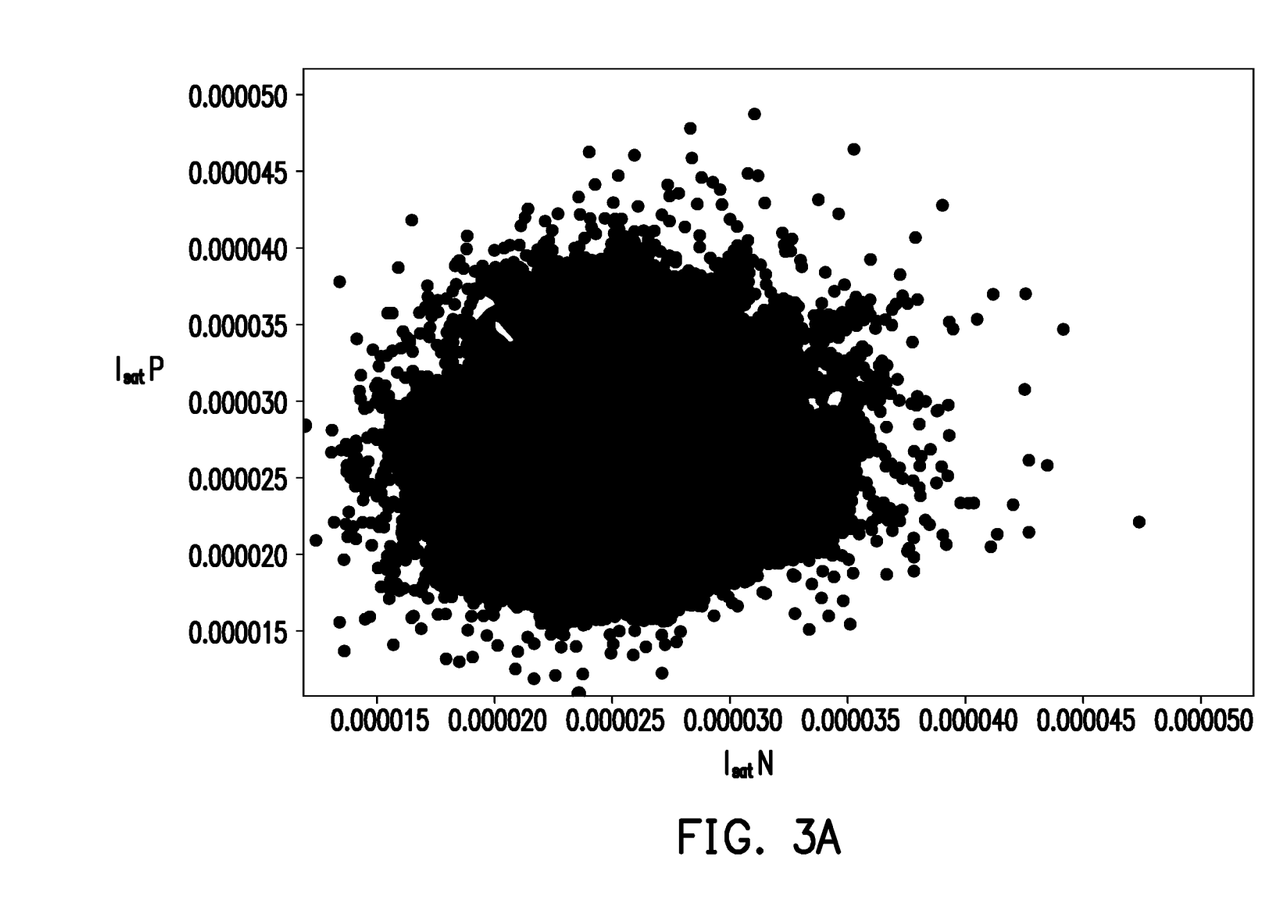
FIG. 3A to FIG. 3H are schematic diagrams illustrating distributions of the process parameter and the wafer characteristic according to an embodiment of the invention.
Figure 3B:
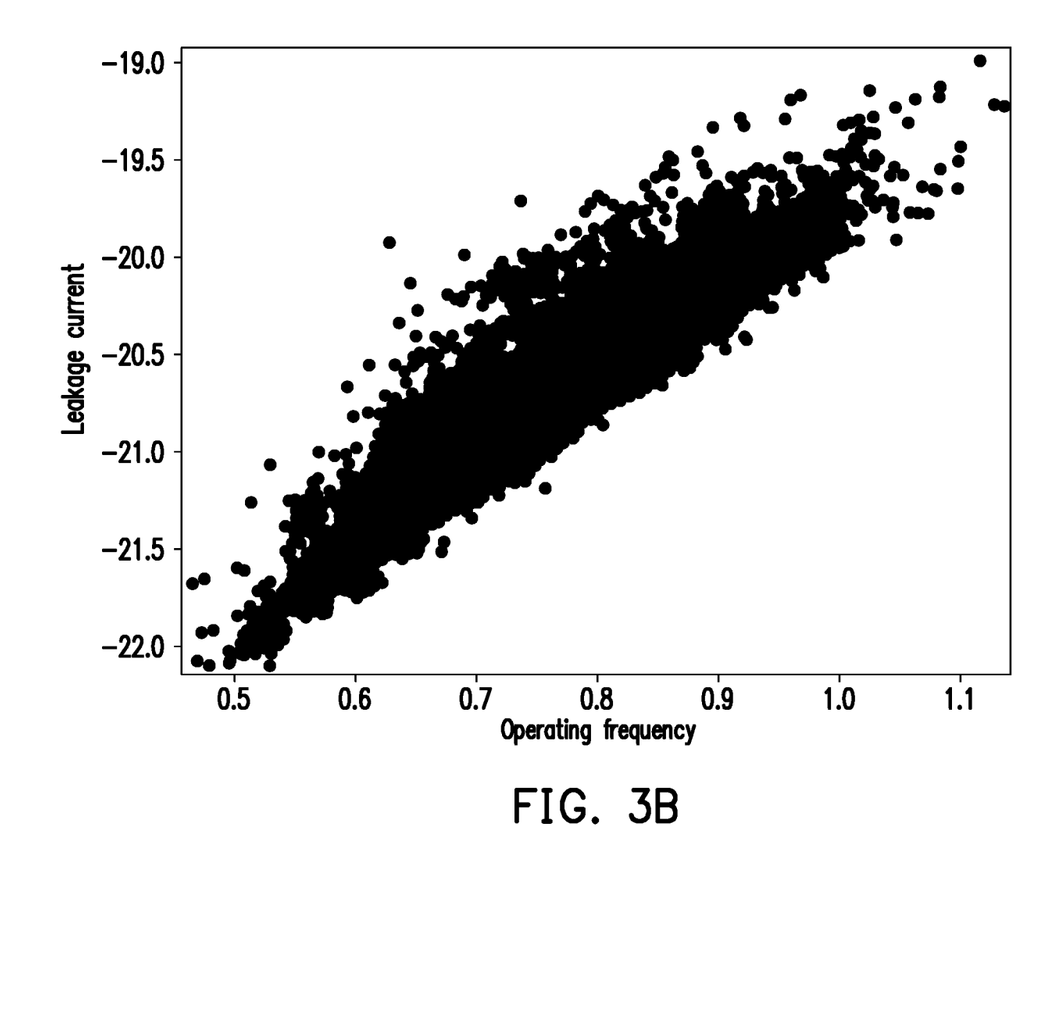

With reference to FIG. 3A and FIG. 3B, the saturation current includes a saturation current acting on PMOS (abbreviated as IsatP) and a saturation current acting on NMOS (abbreviated as IsatN). It is assumed that a distribution range of IsatP and IsatN for training the prediction model 202 in a chart is as shown by FIG. 3A. In FIG. 3A, the vertical axis is IsatP and the horizontal axis is IsatN. In addition, a distribution range of the operating frequency and the leakage current corresponding to the distribution range of IsatP and IsatN in FIG. 3A is as shown by FIG. 3B. In FIG. 3B, the vertical axis is the leakage current and the horizontal axis is the operating frequency. The processor 14 can train and generate the prediction model 202 by using IsatP and IsatN of FIG. 3A and the operating frequency and the leakage current of FIG. 3B.

Figure 3C:
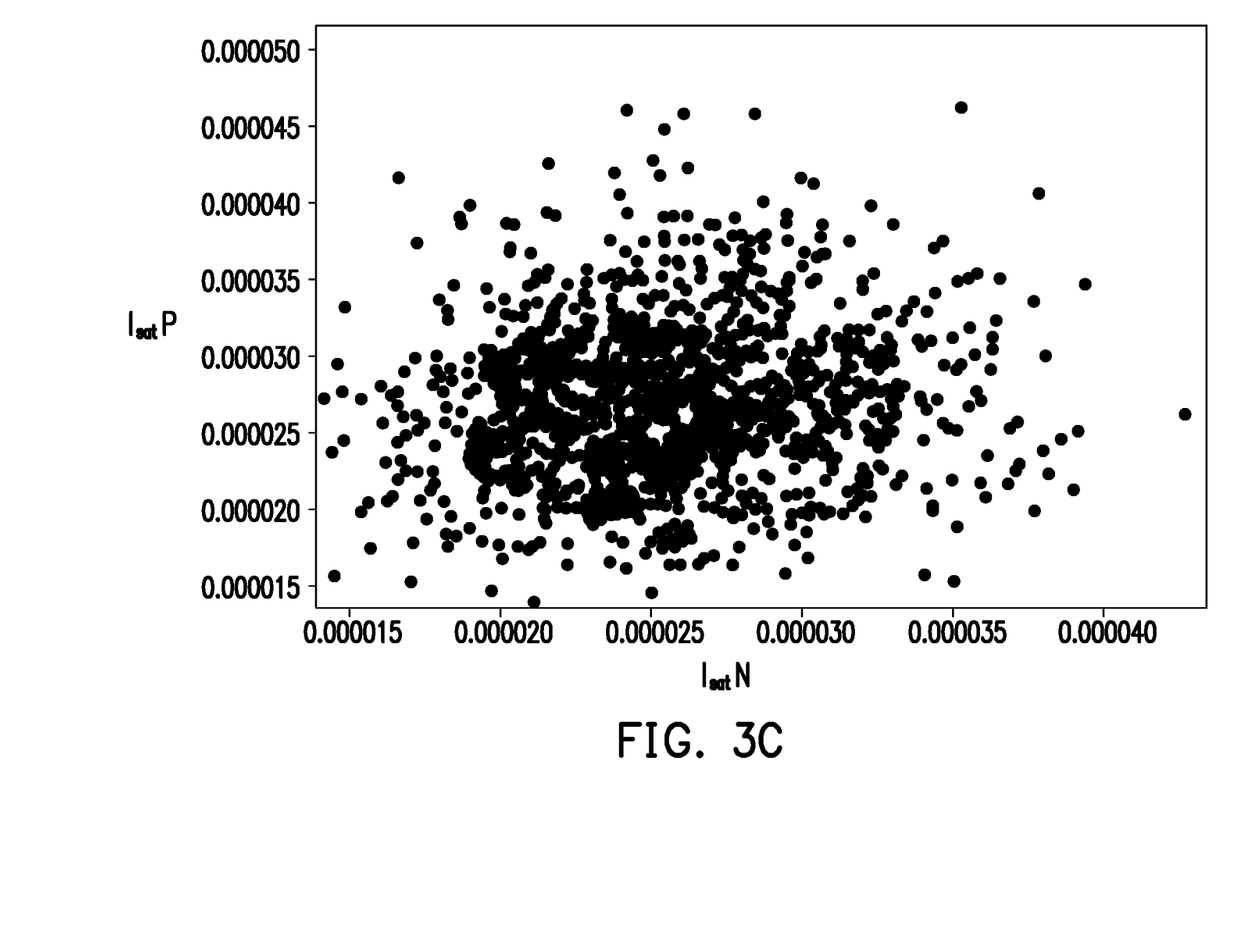
Figure 3D:
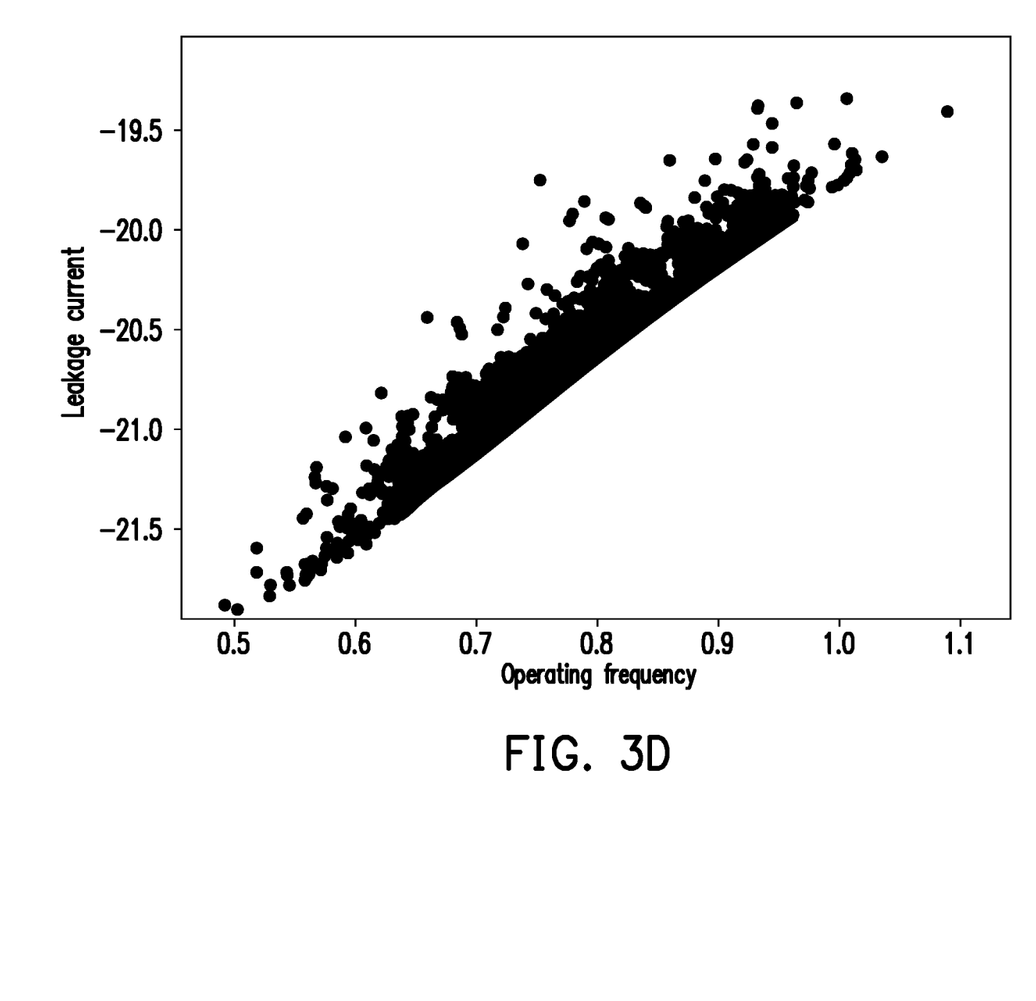

With reference to FIG. 3C and FIG. 3D, it is assumed that a distribution range of IsatP and IsatN used during the mass production in a chart is as shown by FIG. 3C. By inputting IsatP and IsatN in FIG. 3C to the prediction model 202, a distribution range of the operating frequency and the leakage current as shown in FIG. 3D can then be obtained. Accordingly, the operating frequency and the leakage current of the wafer being mass produced can be obtained according to IsatP and IsatN used during the mass production of the wafer.

Figure 3E:
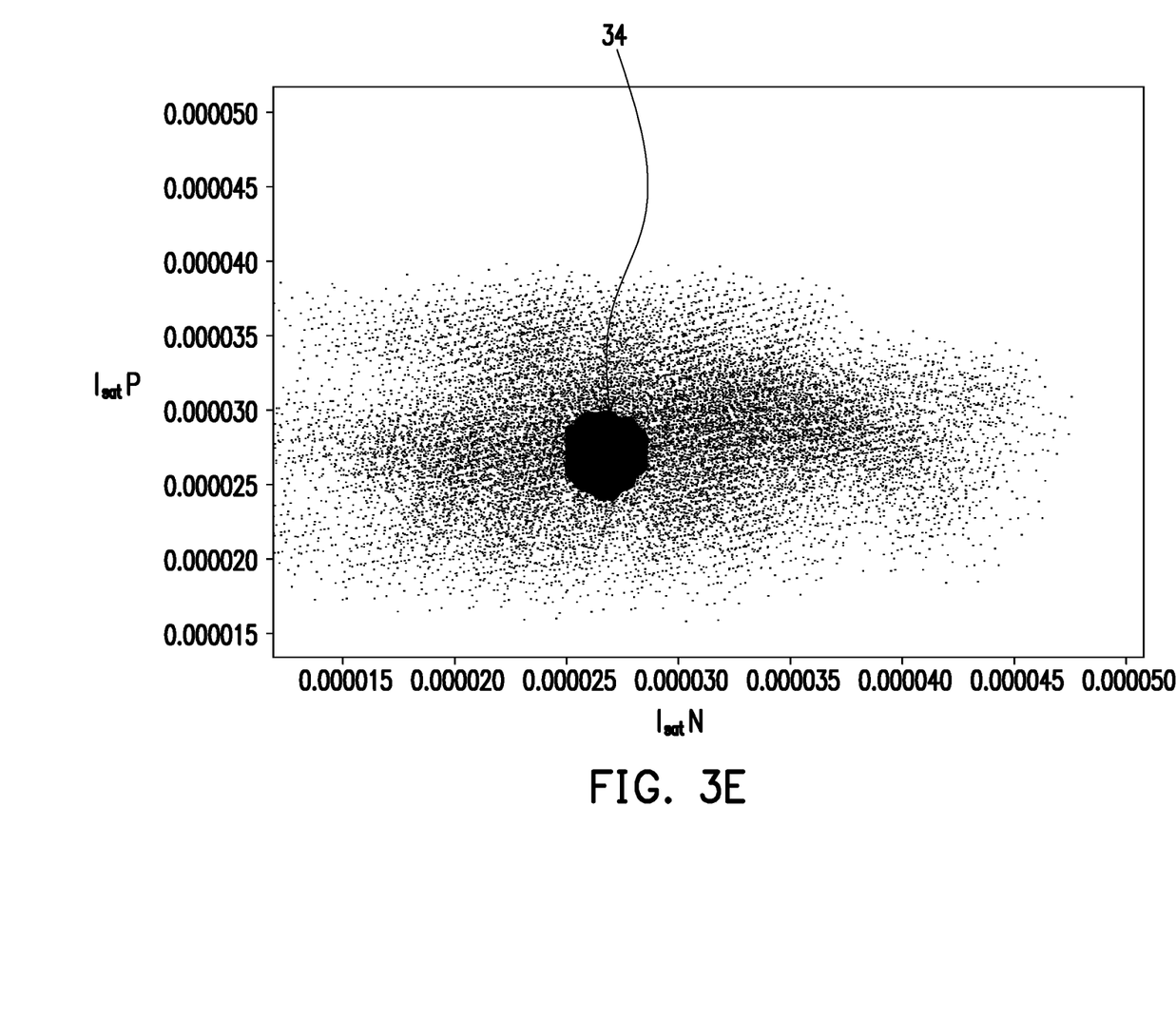
Figure 3F:
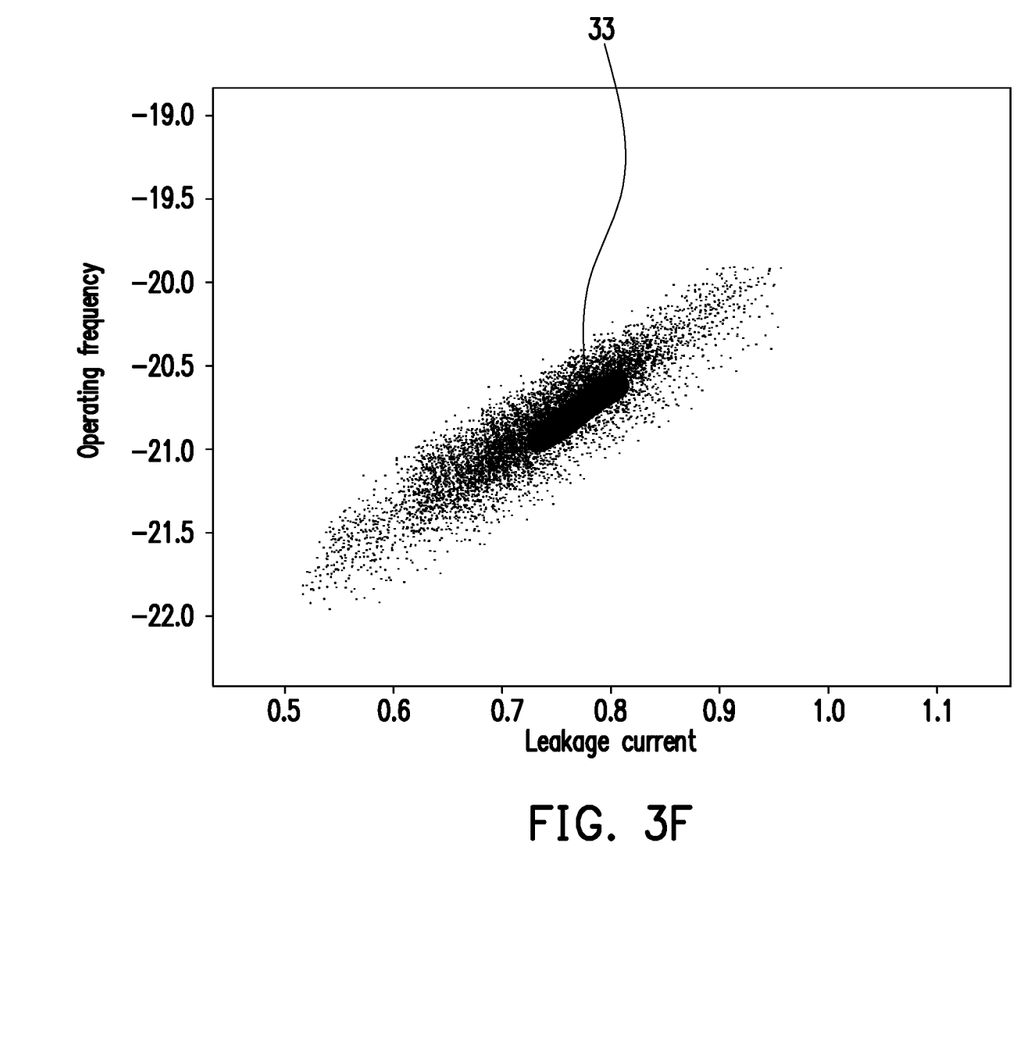

Further, in this embodiment, the processor 14 can also use the prediction model 202 according to a target wafer characteristic to be achieved to obtain the process parameter corresponding to the target wafer characteristic. More specifically, with reference to FIG. 3E and FIG. 3F, it is assumed that a distribution range of IsatP and IsatN used during the mass production in a chart is as shown by FIG. 3E. By inputting IsatP and IsatN in FIG. 3E to the prediction model 202, a distribution range of the operating frequency and the leakage current as shown in FIG. 3F can then be obtained. If the target wafer characteristic to be achieved is located at a location 33 in FIG. 3F, the processor 14 can use the prediction model 202 to obtain the process parameter corresponding to the target wafer characteristic at the location 33 by performing a backcalculation according to a value of the wafer characteristic at the location 33. Here, the process parameter corresponding to the target wafer characteristic at the location 33 is located at a location 34 in FIG. 3E. On this basis, the corresponding process parameter may be found according to the target wafer characteristic desired so the found process parameter can be directly used during the actual production of the wafer.

Figure 3G:
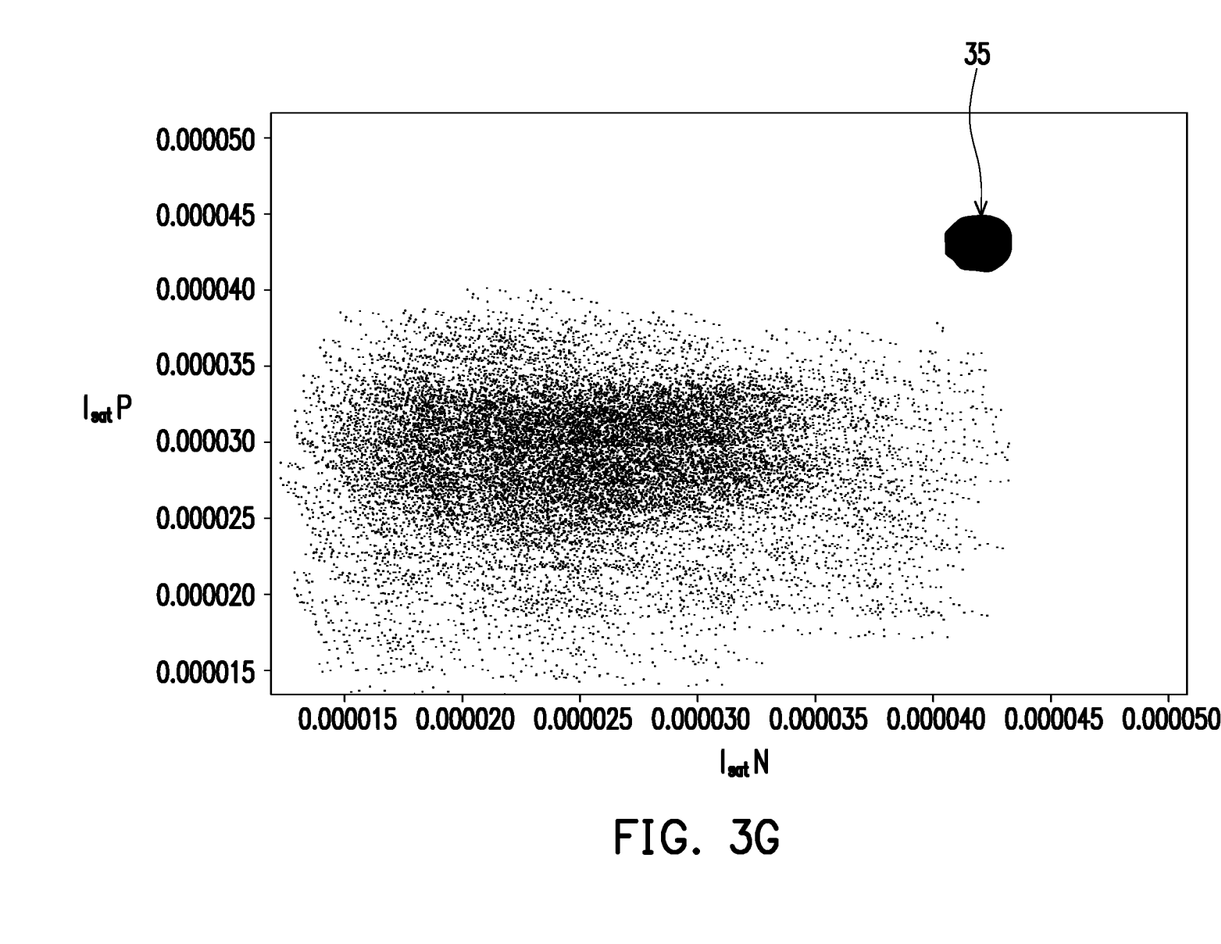
Figure 3H:
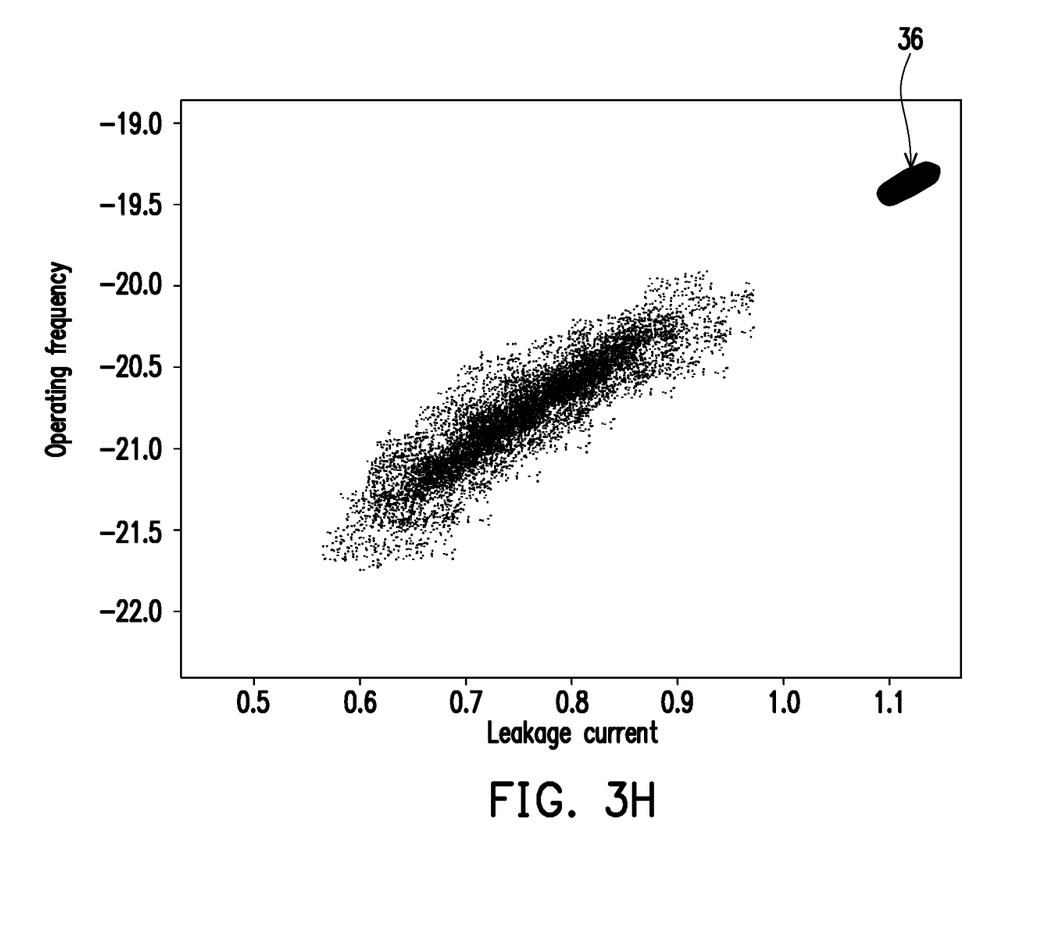

In this embodiment, the processor 14 can use the prediction model 202 to obtain the wafer characteristic corresponding to the target process parameter according to a target process parameter to be used. More specifically, with reference to FIG. 3G and FIG. 3H, it is assumed that a distribution range of IsatP and IsatN used during the mass production in a chart is as shown by FIG. 3G. By inputting IsatP and IsatN in FIG. 3G to the prediction model 202, a distribution range of the operating frequency and the leakage current as shown in FIG. 3H can then be obtained. If the target process parameter to be used is located at a location 35 in FIG. 3G, the processor 14 can use the prediction model 202 to derive the wafer characteristic corresponding to the target process parameter at the location 35 according to a value of the process parameter at the location 35. Here, the wafer characteristic corresponding to the target process parameter at the location 35 is located at a location 36 in FIG. 3H. Accordingly, the corresponding wafer characteristic may be derived by using the target process parameter to be used. In particular, the target process parameter to be used is located at the location 35 in FIG. 3G, but the location 35 is not located within the distribution range of IsatP and IsatN used during the mass production in FIG. 3G. In other words, an inputtable range of the prediction model 202 is greater than an inputtable range of the original SPICE model. In addition, the wafer characteristic of the target process parameter output by the prediction model 202 is located at the location 36 in FIG. 3H, but the location 36 is not located within the distribution range of the wafer characteristic being mass produced in FIG. 3H corresponding to IsatP and IsatN used in FIG. 3G. In other words, an outputtable range of the prediction model 202 is greater than an outputtable range of the original SPICE model.

Further, in an embodiment, the processor 14 also obtains a numerical range to be additionally considered for the wafer characteristic when executing a sing-off operation according to a shift between a mean value (a.k.a. a first mean value) of the process parameter (e.g., IsatP and IsatN) of the wafer during the mass production and a mean value (a.k.a. a second mean value) of the process parameter (e.g., IsatP and IsatN) in the prediction model 202. For instance, the processor 14 can find the wafer characteristic corresponding to the first mean value (hereinafter, also known as a first wafer characteristic) through the prediction model 202. The processor 14 can find the wafer characteristic corresponding to the second mean value (hereinafter, also known as a second wafer characteristic) through the prediction model 202. The difference between values of the first wafer characteristic and the second wafer characteristic (e.g., the difference in terms of the operating frequency) may be used as the numerical range to be additionally considered for the wafer characteristic when executing the sign-off operation. How to execute the sign-off operation may be learnt from the conventional technology, which is not repeated hereinafter.

Here, it should be noted that, a range of the process parameter in the prediction model 202 is greater than a range of the process parameter in the SPICE model. In addition, a predictable range corresponding to the wafer characteristic in the prediction model 202 is greater than a predictable range corresponding to the wafer characteristic in the SPICE model. In other words, the predictable range corresponding to the wafer characteristic in the prediction model 202 is greater than the predictable range corresponding to the wafer characteristic in the SPICE model. Accordingly, not only can the wafer characteristic 204 of the wafer being mass produced be predicted more effectively, but the timing sign-off operation can also be executed more effectively.

Figure 4:
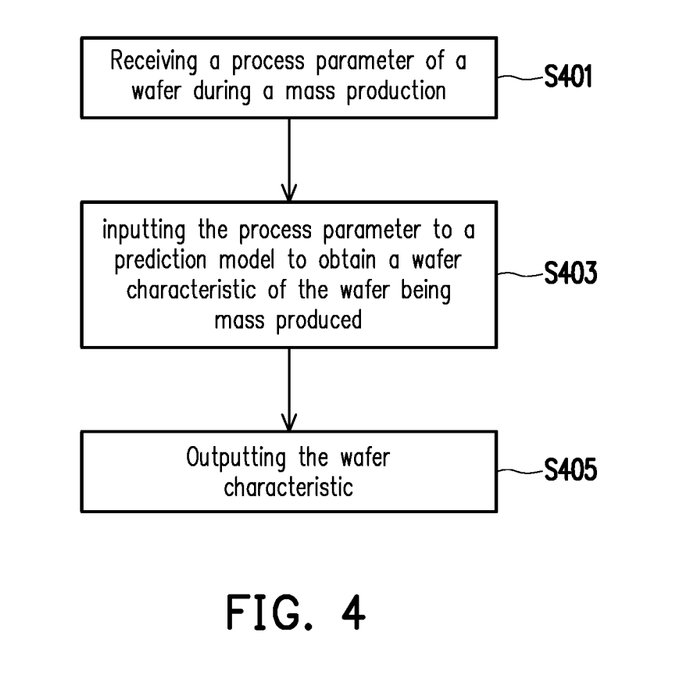
FIG. 4 is a flowchart illustrating a wafer characteristic prediction method according to an embodiment of the invention.

FIG. 4 is a flowchart illustrating a wafer characteristic prediction method according to an embodiment of the invention.

With reference to FIG. 4, in step S401, the input circuit 10 receives a process parameter of a wafer during a mass production. In step S403, the processor 14 inputs the process parameter to a prediction model to obtain a wafer characteristic of the wafer being mass produced. In step S405, the output circuit 12 outputs the wafer characteristic.

In summary, the wafer characteristic prediction method and the electronic device of the invention can generate the training data through the SPICE model, and train the prediction model according to the training data. Then, the prediction model may be used to predict the wafer characteristic of the wafer being mass produced according to the process parameter of the wafer during the mass production. In particular, the predictable range corresponding to the wafer characteristic in the prediction model is greater than the predictable range corresponding to the wafer characteristic in the SPICE model. Accordingly, not only can the wafer characteristic of the wafer being mass produced be predicted effectively, but the timing sign-off operation can also be executed more effectively.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A wafer characteristic predication method for an electronic device, the electronic device comprising an input circuit, a processor and an output circuit, the method comprising:
   receiving a process parameter of a wafer during a mass production by the input circuit;
   inputting the process parameter to a prediction model to obtain a wafer characteristic of the wafer being mass produced by the processor; and
   outputting the wafer characteristic by the output circuit.

2. The wafer characteristic predication method of claim 1, wherein before the step of receiving the process parameter of the wafer during the mass production, the method further comprises:
   performing a simulation to obtain training data by the processor, wherein the training data comprises a training process parameter and a training wafer characteristic; and
   training the prediction model according to the training data by the processor.

3. The wafer characteristic predication method of claim 2, wherein the step of performing the simulation to obtain the training data comprises:
   executing a simulation including a SPICE (Simulation Program with Integrated Circuit Emphasis) model to simulate a test circuit, and obtaining the training data according to a simulation result of the test circuit by the processor,
   wherein a range of the process parameter in the prediction model is greater than a range of the process parameter in the SPICE model, and a predictable range corresponding to the wafer characteristic in the prediction model is greater than a predictable range corresponding to the wafer characteristic in the SPICE model.

4. The wafer characteristic predication method of claim 3, wherein the step of executing the SPICE model to simulate the test circuit comprises:
   executing a SPICE Monte Carlo analysis to simulate the test circuit by the processor.

5. The wafer characteristic predication method of claim 1, wherein the process parameter comprises at least one of a saturation current, a cutoff region current, a linear region threshold voltage and a saturation region threshold voltage.

6. The wafer characteristic predication method of claim 1, wherein the wafer characteristic comprises an operating frequency and a leakage current.

7. The wafer characteristic predication method of claim 1, further comprising:
   using the prediction model according to a target wafer characteristic to be achieved to obtain the process parameter corresponding to the target wafer characteristic by the processor.

8. The wafer characteristic predication method of claim 1, further comprising:
   obtaining a numerical range to be additionally considered for the wafer characteristic when executing a sing-off operation according to a shift between a first mean value of the process parameter and a second mean value of another process parameter in the prediction model by the processor.

9. An electronic device, comprising:
   an input circuit;
   an output circuit; and
   a processor, each of the input circuit and the output circuit being coupled to the processor, wherein
   the input circuit receives a process parameter of a wafer during a mass production,
   the processor inputs the process parameter to a prediction model to obtain a wafer characteristic of the wafer being mass produced, and
   the output circuit outputs the wafer characteristic.

10. The electronic device of claim 9, wherein before the operation of receiving the process parameter of the wafer during the mass production,
    the processor performs a simulation to obtain training data, wherein the training data comprises a training process parameter and a training wafer characteristic, and
    the processor trains the prediction model according to the training data.

11. The electronic device of claim 10, wherein in the operation of performing the simulation to obtain the training data,
    the processor executes a simulation including a SPICE (Simulation Program with Integrated Circuit Emphasis) model to simulate a test circuit, and obtains the training data according to a simulation result of the test circuit,
    wherein a range of the process parameter in the prediction model is greater than a range of the process parameter in the SPICE model, and a predictable range corresponding to the wafer characteristic in the prediction model is greater than a predictable range corresponding to the wafer characteristic in the SPICE model.

12. The electronic device of claim 11, wherein in the operation of executing the SPICE model to simulate the test circuit,
    the processor executes a SPICE Monte Carlo analysis to simulate the test circuit.

13. The electronic device of claim 9, wherein the process parameter comprises at least one of a saturation current, a cutoff region current, a linear region threshold voltage and a saturation region threshold voltage.

14. The electronic device of claim 9, wherein the wafer characteristic comprises an operating frequency and a leakage current.

15. The electronic device of claim 9, wherein
    the processor uses the prediction model according to a target wafer characteristic to be achieved to obtain the process parameter corresponding to the target wafer characteristic.

16. The electronic device of claim 9, wherein
the processor obtains a numerical range to be additionally considered for the wafer characteristic when executing a sing-off operation according to a shift between a first mean value of the process parameter and a second mean value of another process parameter in the prediction model.

\* \* \* \* \*